United States Patent
Liu et al.

(10) Patent No.: US 10,457,549 B2
(45) Date of Patent: Oct. 29, 2019

(54) SEMICONDUCTIVE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yen-Cheng Liu, New Taipei (TW); Cheng-Yu Hsieh, Hsinchu (TW); Shang-Ying Tsai, Taoyuan County (TW); Kuei-Sung Chang, Kaohsiung (TW)

(73) Assignee: TAIWAN SEMICONDUCTOR MANFACTURING COMPANY LTD., Hsinchu (TW)

( * ) Notice: Subject to any disclaimer, the term of this patent is extended or adjusted under 35 U.S.C. 154(b) by 5 days.

(21) Appl. No.: 15/618,914

(22) Filed: Jun. 9, 2017

(65) Prior Publication Data

US 2018/0222750 A1 Aug. 9, 2018

Related U.S. Application Data

(60) Provisional application No. 62/454,352, filed on Feb. 3, 2017.

(51) Int. Cl.
*B81C 1/00* (2006.01)
*B81B 7/00* (2006.01)
*B81B 7/02* (2006.01)

(52) U.S. Cl.
CPC ........ *B81B 7/02* (2013.01); *B81B 2201/0235* (2013.01); *B81B 2201/0242* (2013.01); *B81B 2201/0264* (2013.01); *B81B 2203/0315* (2013.01); *B81B 2207/012* (2013.01); *B81B 2207/07* (2013.01); *B81B 2207/096* (2013.01); *B81C 1/0023* (2013.01); *B81C 2203/0118* (2013.01); *B81C 2203/036* (2013.01); *B81C 2203/037* (2013.01); *B81C 2203/0792* (2013.01)

(58) Field of Classification Search
CPC . B81B 7/02; B81B 7/0035–0041; B81B 7/04; B81B 2201/0264; B81C 2203/0145; B81C 1/00277–00293; B81C 1/00269; H01L 29/84
See application file for complete search history.

(56) References Cited

U.S. PATENT DOCUMENTS

| | | | |
|---|---|---|---|
| 8,350,346 B1 * | 1/2013 | Huang | ................ B81B 3/0051 257/414 |
| 8,900,905 B1 * | 12/2014 | Liu | ...................... G01L 9/0042 257/254 |
| 9,656,857 B2 | 5/2017 | Huang et al. | |

(Continued)

*Primary Examiner* — Eric A. Ward
(74) *Attorney, Agent, or Firm* — WPAT, P.C., Intellectual Property Attorneys; Anthony King

(57) ABSTRACT

A semiconductive structure includes a first substrate comprising an interconnection layer and a first conductor protruding from the interconnection layer, a second substrate comprising a second conductor bonded with the first conductor, a first cavity between and sealed by the first substrate and the second substrate and the first cavity has a first cavity pressure, a second cavity between and sealed by the first substrate and the second substrate and the second cavity has a second cavity pressure, a first surface of the interconnection layer is a sidewall of the first cavity, wherein the first cavity pressure is less than the second cavity pressure.

20 Claims, 12 Drawing Sheets

(56) References Cited

U.S. PATENT DOCUMENTS

| | | | | |
|---|---|---|---|---|
| 2012/0126349 A1* | 5/2012 | Horning | ............... | B81B 7/0038 |
| | | | | 257/417 |
| 2015/0129991 A1* | 5/2015 | Lee | ........................ | B81B 7/02 |
| | | | | 257/415 |
| 2015/0158720 A1* | 6/2015 | Lim | ................... | B81C 1/00285 |
| | | | | 257/415 |
| 2015/0284240 A1* | 10/2015 | Chu | ..................... | B81B 7/0041 |
| | | | | 257/415 |
| 2015/0329353 A1* | 11/2015 | Cheng | ................. | B81B 7/0041 |
| | | | | 257/415 |
| 2015/0360939 A1* | 12/2015 | Zhang | ................ | B81C 1/00246 |
| | | | | 438/51 |
| 2016/0083248 A1* | 3/2016 | Xu | .................. | H01L 21/823437 |
| | | | | 257/415 |
| 2016/0084865 A1* | 3/2016 | Kaelberer | ............... | B81B 7/02 |
| | | | | 73/511 |
| 2017/0050841 A1 | 2/2017 | Liu et al. | | |
| 2017/0081181 A1* | 3/2017 | Zhang | ................ | B81C 1/00333 |

\* cited by examiner

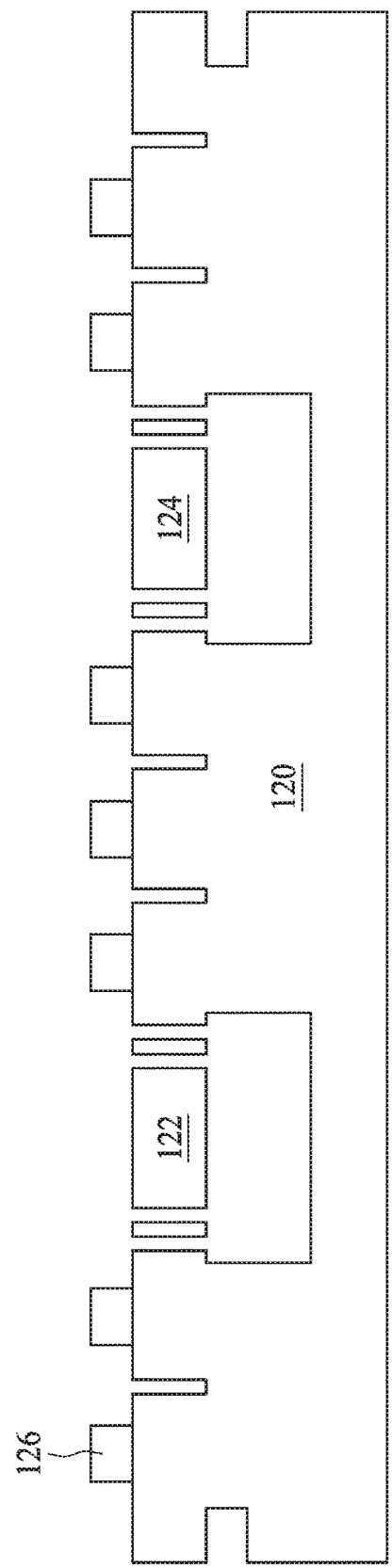

SEMICONDUCTIVE STRUCTURE AND MANUFACTURING METHOD THEREOF

CROSS-REFERENCE TO RELATED APPLICATIONS

The present application claims priority of U.S. Provisional Patent Application Ser. No. 62/454,352, filed on Feb. 3, 2017, which is incorporated herein by reference in its entirety.

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes mechanical and electrical features formed by one or more semiconductor manufacturing processes. The MEMS device includes fabrication using semiconductive materials to form mechanical and electrical features. For many applications, MEMS device is electrically connected to external circuitry to form complete MEMS systems. Commonly, the connections are formed by wire bonding. The MEMS device may include a number of elements (e.g., stationary or movable elements) for achieving electro-mechanical functionality. MEMS devices are widely used in various applications. MEMS applications include pressure sensors, printer nozzles, or the like. Moreover, MEMS applications are extended to optical applications, such as movable mirrors, and radio frequency (RF) applications, such as RF switches or the like.

Conventionally, MEMS devices require different pressures in the hermetic cavities. For example, an accelerometer requires an enclosure with greater pressure while a gyroscope or a resonator requires an enclosure with lower pressure. However, these MEMS devices are manufactured in the same bonding process. As a result, these MEMS devices in integrated chips have to operate in the same pressure, which will cause certain limitations and constraints. Therefore, there is a continuous need to modify structure and manufacturing method of the MEMS devices in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2J are schematic cross-sectional views at one of various operations of manufacturing device according to some embodiments of the present disclosure.

DETAILED DESCRIPTION OF THE DISCLOSURE

Figure 1:
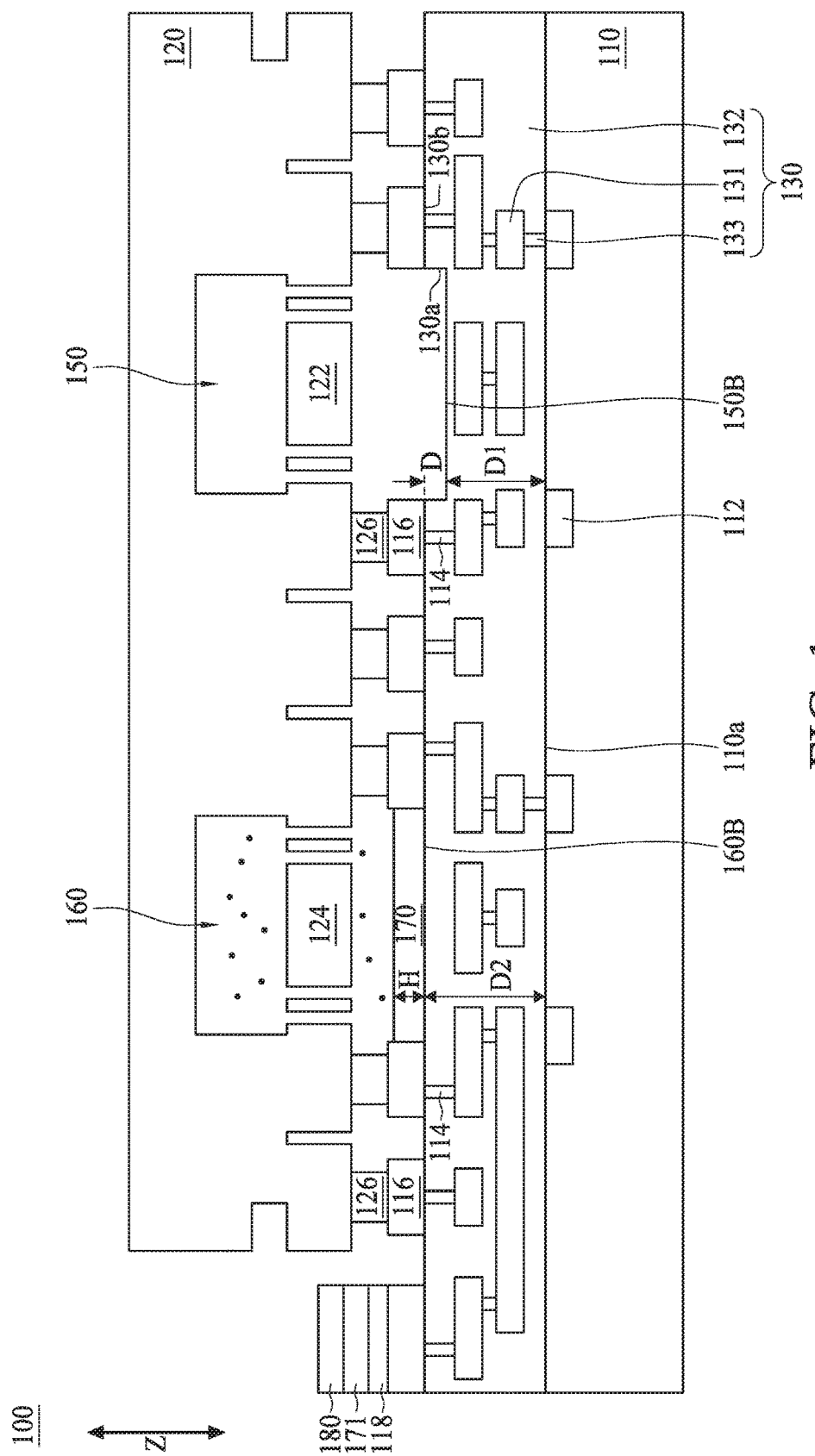
FIG. 1 is a schematic cross-sectional view of a semiconductive structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, compounds, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "substantially" refers to the complete or nearly complete extent or degree of an action, characteristic, property, state, structure, item, or result. For example, a surface that is "substantially" coplanar with another surface would mean that these two surfaces are either completely located in the same plane or nearly completely located in the same plane. The exact allowable degree of deviation from absolute completeness may in some cases depend on the specific context. However, generally speaking the nearness of completion will be so as to have the same overall result as if absolute and total completion were obtained.

As used herein, multiple MEMS devices can be integrated onto a semiconductive substrate in recent generation of MEMS applications. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement, and the gyroscope detects angular movement. To meet consumer's demand for low cost, high quality, and small device footprint, the accelerometer and the gyroscope can be formed from MEMS devices, which are integrated together on a same substrate by same manufacturing processes. However, the accelerometer and the gyroscope utilize different operating conditions. For example, an accelerometer requires an enclosure with greater pressure while a gyroscope requires an enclosure with lower pressure. In some embodiments, a pressure in the enclosures of a gyroscope is less than or equal to 0.001 millibar (mbar).

Therefore, the present disclosure is directed to a semiconductive structure including multiple MEMS devices that are integrated on a substrate. The semiconductive structure includes a first substrate comprising a dielectric layer and a first conductor protruding from the dielectric layer. The semiconductive structure includes a second substrate comprising a second conductor bonded with the first conductor. The second substrate includes a first device and the second device and these devices are between and sealed by the first substrate and the second substrate. A first cavity and a second cavity are formed when the second substrate is eutectic bonded with the first substrate. As such, the first device and the second device are disposed within a first cavity and a second cavity respectively.

An outgassing layer in the second cavity permits adjustment or change of the second cavity pressure. Subsequent heating causes the outgassing layer releases gas from the second cavity. Pressure is directly proportional to a number of gas molecules in the second cavity. The number of gas molecules in the second cavity rises, the pressure also rises. In some cases, the second cavity pressure is adjusted to 1 atmospheric pressure (ambient environment) by the heating the outgassing layer. The outgassing layer may physically remain or disappear in the second cavity after the heating.

FIG. 1 illustrates a schematic cross-sectional view of a semiconductive structure 100 in accordance with some embodiments of the present disclosure. The semiconductive structure 100 includes a first substrate 110, a second substrate 120, a first cavity 150 and a second cavity 160. In some embodiments, the semiconductive structure 100 is configured for sensing movement, pressure or etc. In some embodiments, the semiconductive structure 100 is configured for sensing linear motion and angular motion. In some embodiments, the semiconductive structure 100 includes one or more sensing devices. In some embodiments, the semiconductive structure 100 is in dual or multiple cavity pressures, as the sensing devices are operated under more than one cavity pressures.

In some embodiments, the first substrate 110 may be a semiconductor substrate, such as a bulk semiconductor substrate. The hulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the first substrate 110 includes a multilayered substrate, such as a silicon-on-insulator (SOI) substrate, which includes a bottom semiconductor layer, a buried oxide layer (BOX) and a top semiconductor layer. In some embodiments, the first substrate 110 includes several circuitries and one or more active elements such as transistors etc. disposed over or in the first substrate 110. In some embodiments, the circuitries formed over or in the first substrate 110 may be any type of circuitries suitable for a particular application, In accordance with some embodiments, the circuitries may include various n-type metal-oxide semiconductor (NMOS) and/or p-type metal-oxide semiconductor (PMOS) devices such as transistors, capacitors, resistors, diodes, photo-diodes, fuses and/or like. The circuitries may be interconnected to perform one or more functions. In some embodiments, the first substrate 110 includes CMOS components disposed over or in the first substrate 110. In some embodiments, the first substrate 110 is a CMOS substrate.

In some embodiments, a plurality of active devices 112 including transistor devices such as CMOS devices is formed in proximity to a surface of the first substrate 110. In some embodiments, the active devices 112 are a portion of active circuitry configured to perform calculations or execute procedures based on signals received from a MEMS device, for example 122 and 124 shown in FIG. 1. In some embodiments, the active devices 112 can also be referred to as a circuitry substrate. For illustration, only a portion of the active device 112 is shown in FIG. 1.

In some embodiments, an interconnection layer 130 is disposed over the first substrate 101 and electrically coupled to the active devices 112. In some embodiments, the interconnection layer 130 includes metallization layer(s) 131 and dielectric layer(s) 132 stacking to one another. In some embodiments, the metallization layer 131 may include metallic materials such as copper, aluminum, or conductive polymers, alloy such as aluminum copper (AlCu), or other suitable conductive materials.

In some embodiments, the dielectric layer 132 may include inter-layered dielectrics or inter-metal dielectrics, which may include low-k dielectric layers, ultra low-k layers, non-low-k dielectric layers such as passivation layers, or the like. Low k materials have a dielectric constant less titan a dielectric constant of silicon oxide. In some embodiments, low k materials have a dielectric constant less than about 3.9. In some embodiments, low k materials include fluorine-doped silicon oxide, carbon-doped silicon oxide, porous silicon oxide, polymer materials, or other suitable low k materials. in some embodiments, ultra-low k materials have a dielectric constant less than or equal to about 2.5. In some embodiments, ultra-low k materials include xerogel, polymers, or other suitable ultra-low k materials. In some embodiments, the interconnection layer 130 may further include vias 133, which may be formed of metal such as copper, aluminum, tungsten, conductive polymers, or other suitable conductive materials, formed in the dielectric layer 132 to electrically couple the metallization layer 131. The interconnection layer 130 is configured to convey signals to and front the active circuitry formed on the first substrate 110. In some embodiments, the interconnection layer 130 may further include conductive vias 114 formed in the dielectric layer 132.

In some embodiments, the semiconductor structure 100 may further include conductors, for example first conductors 116. The first conductors 116 are disposed over the interconnection layer 130. The conductive vias 114 electrically couple the first conductors 116 and the metallization layer 131 of the interconnection layer 130. In some embodiments, the materials of the first conductors 116 may include metallic materials such as copper, aluminum, gold, germanium, tin, indium or other suitable conductive materials. The first conductors 116 may be configured as internal or external terminals. In some embodiments, a portion of the first conductors 116 may be bonded to other conductors formed on another substrate by any suitable bonding methods such as eutectic bonding, fusion bonding, or solid-liquid inter-diffusion bonding (SLID). In some embodiments, a portion of the first conductors 116 may be bonded to external circuitries. In some embodiments, the conductive vias are surrounded by the dielectric materials such as oxide, etc. In some embodiments, as shown in FIG. 1, the first conductors 116 are protruding from a top surface 130b of the interconnection layer 130.

In some embodiments, the semiconductive structure 100 includes the second substrate 120 disposed over the first substrate 110. In some embodiments, the second substrate 120 is bonded with the first substrate 110. In some embodiments, the second substrate 120 includes semiconductive material. In some embodiments, the second substrate 120 includes same material that is used for the first substrate 110. In some embodiments, the second substrate 120 includes material different from that of the first substrate 110. In some embodiments, the second substrate 120 includes silicon or other suitable materials. In some embodiments, the second substrate 120 includes electrical circuits formed over or in the second substrate 120. In some embodiments, the second substrate 120 includes transistors, capacitors, resistors, diodes, photo-diodes and/or the like. In some embodiments, the second substrate 120 is a MEMS substrate including electro-mechanical elements.

A first device 122 and a second device 124 are disposed between the first substrate 110 and the second substrate 120. In some embodiments, the first device 122 and the second device 124 are MEMS devices. In some embodiments, the first device 122 and the second device 124 are connected to the second substrate 120. In some embodiments, the first device 122 or at least a portion of the first device 122 may be part of the second substrate 120. In some embodiments, the first device 122 or the second device 124 includes, for example, a microphone, a gas pressure sensor, an accelerometer, a gyroscope, a magnetometer, resonator or any other device that interfaces with the external environment. In some embodiments, the first device 122 is a gyroscope for measuring angular velocity. In some embodiments, the second device 124 is an accelerometer for measuring linear acceleration. In some embodiments, the first device 122 and the second device 124 are cooperated to be a motion sensor. For example, the first device 122 and the second device 124 are configured for a motion-activated user interface or for an automotive crash detection system. In some embodiments, the first device 122 or the second device 124 is movable relative to the first substrate 110 or the second substrate 120.

In some embodiments, the second substrate 120 includes a plurality of second conductors 126. In some embodiments, the second conductors 126 are disposed over the second substrate 120, and on a surface of the second substrate 120. In some embodiments, the materials of the second conductors 126 may include metallic materials such as copper, aluminum, gold, germanium, tin, indium or other suitable conductive materials. The second conductors 126 may be configured as internal or external terminals. In some embodiments, a portion of the second conductors 126 may he bonded to another conductors formed on another substrates e.g., CMOS substrates by any suitable bonding methods such as eutectic bonding, fusion bonding, or solid-liquid inter-diffusion bonding (SLID). In some embodiments, a portion of the second conductors 126 may be bonded to external circuitries. In some embodiments, the first conductors 116 and the second conductors 126 are bonded by eutectic bonding. For example, the first conductor 116 is aluminum, and the second conductor 126 is germanium, and the first conductor 116 and the second conductor 126 can form aluminum germanium and eutectically bonded to each other. In some embodiments, the dimension of the second conductor 126 is greater than the dimension of the second conductor 126 so that the melted second conductor 126 can enclose the first conductor to enhance bonding.

In some embodiments, the first substrate 110 and the second substrate 120 are hermetically bonded, thereby defining a first cavity 150 in which the first device 122 is sealed. In some embodiments, the first substrate 110 and the second substrate 120 are bonded, thereby defining a second cavity 160. In some embodiments, the first cavity 150 is hermetically isolated from the second cavity 160, in some embodiments, the first cavity 150 surrounds the first device 122 and the first device 122 is movable within the first cavity 150. In some embodiments, the second cavity 160 surrounds the second device 124 and the second device 124 is movable within the second cavity 160.

In some embodiments, a portion of the interconnection layer 130 is recessed from the top surface 130b of the interconnection layer 130 to have a depth D in the first cavity 150. In some embodiments, a first surface 130a of the interconnection layer 130 is a sidewall of the first cavity 150. In some embodiments, a distance from a bottommost surface 15013 of the first cavity 150 to the first surface 110a of the first substrate 110 is a first distance D1.

In some embodiments, an outgassing layer 170 is disposed on the bottommost surface 160B of the second cavity 160. In some embodiments, the outgassing layer 170 is protruded from the bottommost surface 160B of the second cavity 160 and extended to a height H. In some embodiments, the bottommost surface 160B of the second cavity 160 is substantially co-planar with the top surface 130b of the interconnection layer 130. In some embodiments, a distance from a bottommost surface 160B of the second cavity 160 to the first surface 110a of the first substrate 110 is a second distance D2. In some embodiments, the bottommost surface 1608 of the second cavity 160 is substantially higher than the bottommost surface 150B of the first cavity 150. In some embodiments, the first distance D1 is shorter than the second distance D2.

In some embodiments, the outgassing layer 170 allows gas from the outgassing layer 170 to out gas into the hermetic cavity, for example the second cavity 160, so as to adjust the barometric pressure in the second cavity 160. In some embodiments, the outgassing layer 170 may physically remain or disappear in the second cavity 160. In some embodiments, the outgassing layer 170 can be made of oxide materials. In some embodiments, the outgassing layer 170 may he made of silicon oxide such as Tetraethyl orthosilicate (TEOS). In some embodiments, the outgassing layer 170 may be made of silicon oxide such as high density plasma (HDP) oxide. In some embodiments, the outgassing layer 170 may release enough gas to interfere with industrial vacuum processes. In some embodiments, the outgassing layer 170 may include one or more relatively inert atoms, for example helium, nitrogen or argon.

In some embodiments, an insulating layer 118 is disposed on the first conductor 116 and the insulating layer 118 protects the first conductor 116. In some embodiments, a passivation layer 171 is disposed on the insulating layer 118. The passivation layer 171 includes same material that is used for the outgassing layer 170. In some embodiments, the passivation layer 171 and the outgassing layer 170 are formed at the same deposition operation. In some embodiments, a barrier layer 180 is disposed on the passivation layer 171. In some embodiments, the barrier layer 180 can be made of a high compactness material which presents gas from out-diffusion and the high compactness material can be nitride materials. In some embodiments, the passivation layer 171 and the barrier layer provides compliance and acts as a mechanical cushion for the semiconductive structure 100.

In some embodiments, a first cavity pressure is established in the first cavity 150 by the cooperation of the first substrate 110 and the second substrate 120. In some embodiments, the first cavity 150 is at the first cavity pressure. In some embodiments, the first device 122 is under the first cavity pressure in the first cavity 150. In some embodiments, the first cavity pressure is lower than an atmospheric pressure or a pressure of an ambient environment. In some embodiments, the first cavity 150 is in a vacuum or high vacuum that the first cavity pressure in the first cavity 150 is lower than the atmospheric pressure (1 atm). In some embodiments, the first cavity 150 is in a high vacuum in order to optimize the performance of the first device 122.

In some embodiments, a second cavity pressure is established in the second cavity 160 by the cooperation of the first substrate 110, the second substrate 120 and the outgassing layer 170. Since the outgassing layer 170 allows gas out into the second cavity 160 after the heating process, so as to adjust the barometric pressure in the second cavity 160. In some embodiments, the height H of the outgassing layer 170 is reduced after the heating process. In some embodiments, the outgassing layer 170 is disappeared after the heating process. In some embodiments, the second cavity 160 is at the second cavity pressure of about 1 atm, an ambient environment or other predetermined gas pressure after heating the outgassing layer 170. In some embodiments, the second cavity 160 is in 1 atm in order to optimize the performance of the second device 124. In some embodiments, the second cavity pressure is different from the first cavity pressure at the first cavity 150. In some embodiments, the second cavity pressure in the second cavity 160 is higher than the first cavity pressure in the first cavity 150.

In the present disclosure, a method of manufacturing a semiconductive structure is also disclosed. In some embodiments, a semiconductive structure is formed by a method 200. The method 200 includes a number of operations and the description and illustration are not deemed as a limitation as the sequence of the operations.

Figure 2:
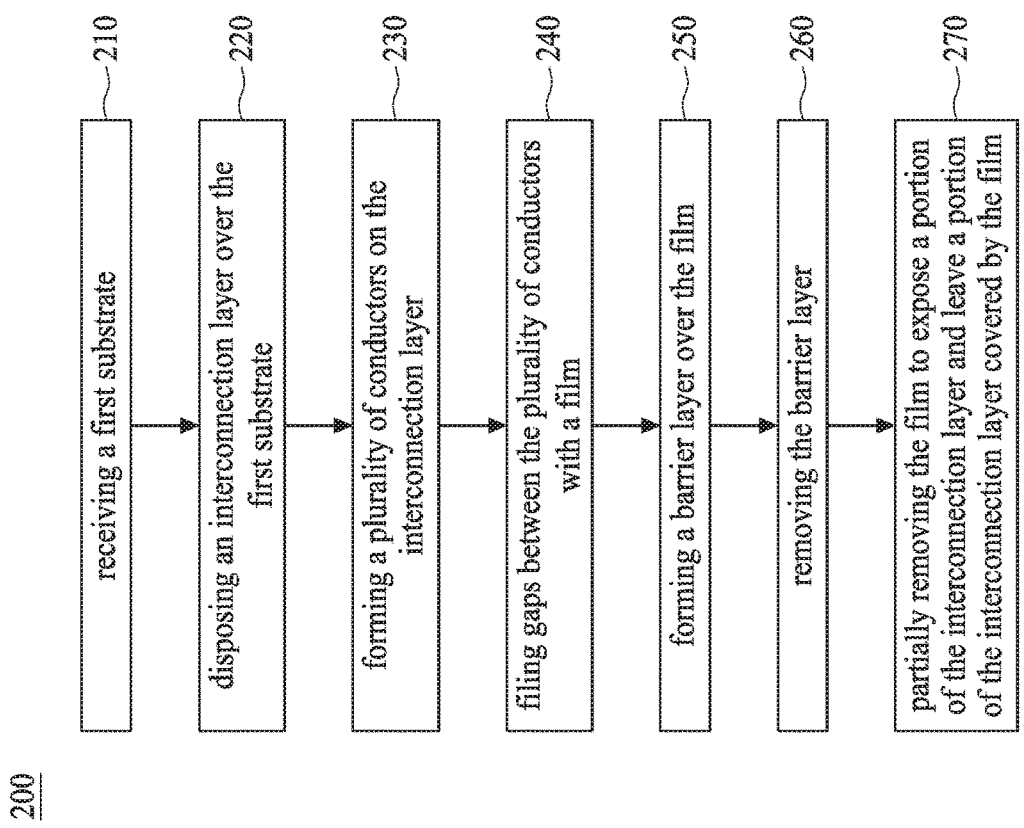
FIG. 2 is a flow diagram of a method of manufacturing a semiconductive structure in accordance with some embodiments of the present disclosure.

FIG. 2 is a flow chart illustrating a method for manufacturing a semiconductive structure according to various aspects of the present disclosure, The method 200 begins with operation 210 in which a first substrate is received. The method 200 continues with operation 220 in which an interconnection layer is disposed over the first substrate. The method 200 proceeds with operation 230 in which a plurality of conductors are formed on the interconnection layer. The method 200 continues with operation 240 in which a plurality of gaps between the plurality of conductors are filled with a film. The method 200 continues with operation 250 in which a barrier layer is formed over the film. The method 200 continues with operation 260 in which the barrier layer is removed. The method 200 continues with operation 270 in which the film is partially removed to expose a portion of the interconnection layer and leave a portion of the interconnection layer covered by the film.

Figure 2A:
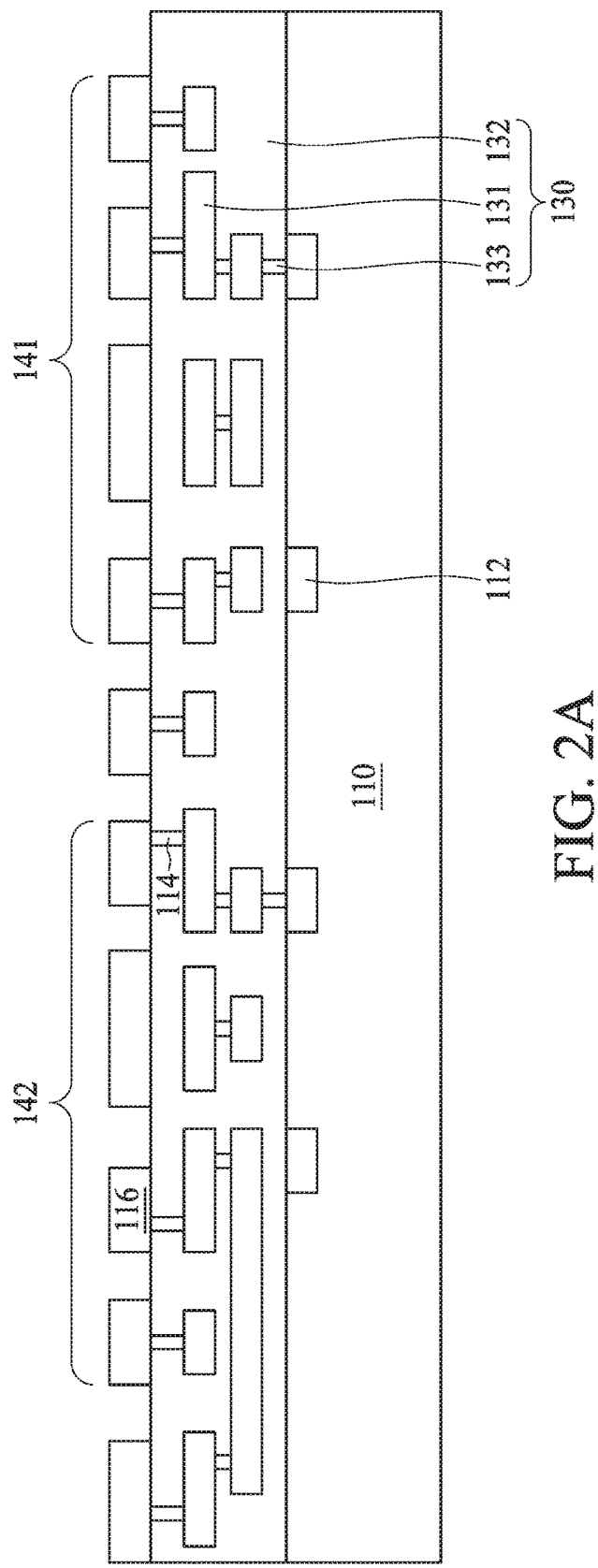

FIGS. 2A-2J are cross-sectional views at one of various operations of manufacturing a semiconductive structure according to some embodiments of the present disclosure. As depicted in FIG. 2A and operations 210 and 220 in FIG. 2, a first substrate 110 is received or provided. In some embodiments, the first substrate 110 includes a first region 141 and a second region 142 configured to form different MEMS devices respectively. A plurality of active devices 112 such as CMOS devices is formed in proximity to a surface of the first substrate 110. An interconnection layer 130 is formed over the first substrate 110 and electrically coupled to the active devices 112. in some embodiments, the interconnection layer 130 includes metallization layer(s) 131, dielectric layer(s) 132, vias 133 and conductive vias 114.

Figure 2B:
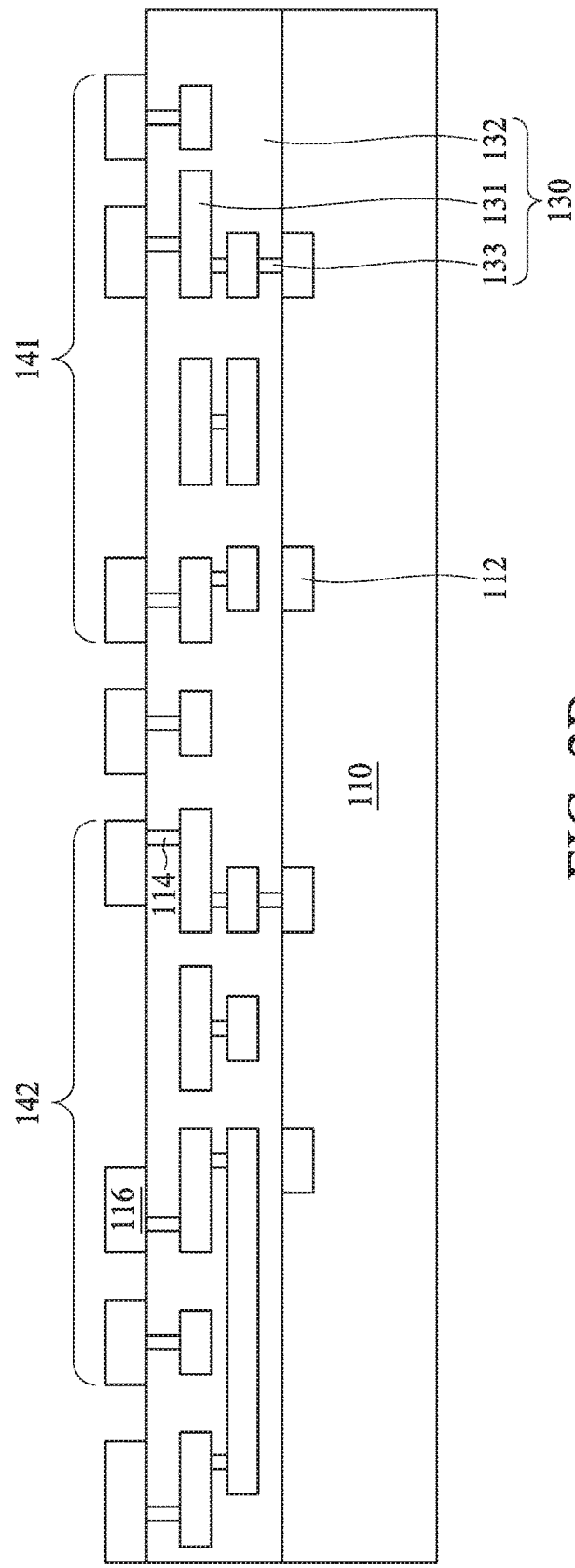

As depicted in FIG. 2A and operation 230 in FIG. 2, a plurality of the conductive vias 114 electrically connect the exposed metallization layer 131. A plurality of first conductors 116 are formed on the interconnection layer 130. The conductive vias 114 electrically couple the first conductors 116 and the metallization layer 131 of the interconnection layer 130. In some embodiments, the first conductors 116 are formed by depositing a metal layer on the interconnection layer 130 and pattering the metal layer with lithography. In some embodiments, the materials of the first conductors 116 may include metallic materials such as copper, aluminum, gold, germanium, tin, indium or other suitable conductive materials. In some embodiments, the first conductors 116 are configured to receive an interconnect structure or electrically connect with external circuitry or conductive element. In some embodiments, a portion of the first conductors 116 may be bonded to another conductors formed on another substrates e.g., MEMS substrates by any suitable bonding methods such as eutectic bonding, fusion bonding, or solid-liquid inter-diffusion bonding (SLID). In some embodiments, a portion of the first conductors 116 may be bonded to external circuitries. As depicted in FIG. 2B, a portion of the first conductors 116 in the first region 141 and in the second region 142 are removed.

Figure 2C:
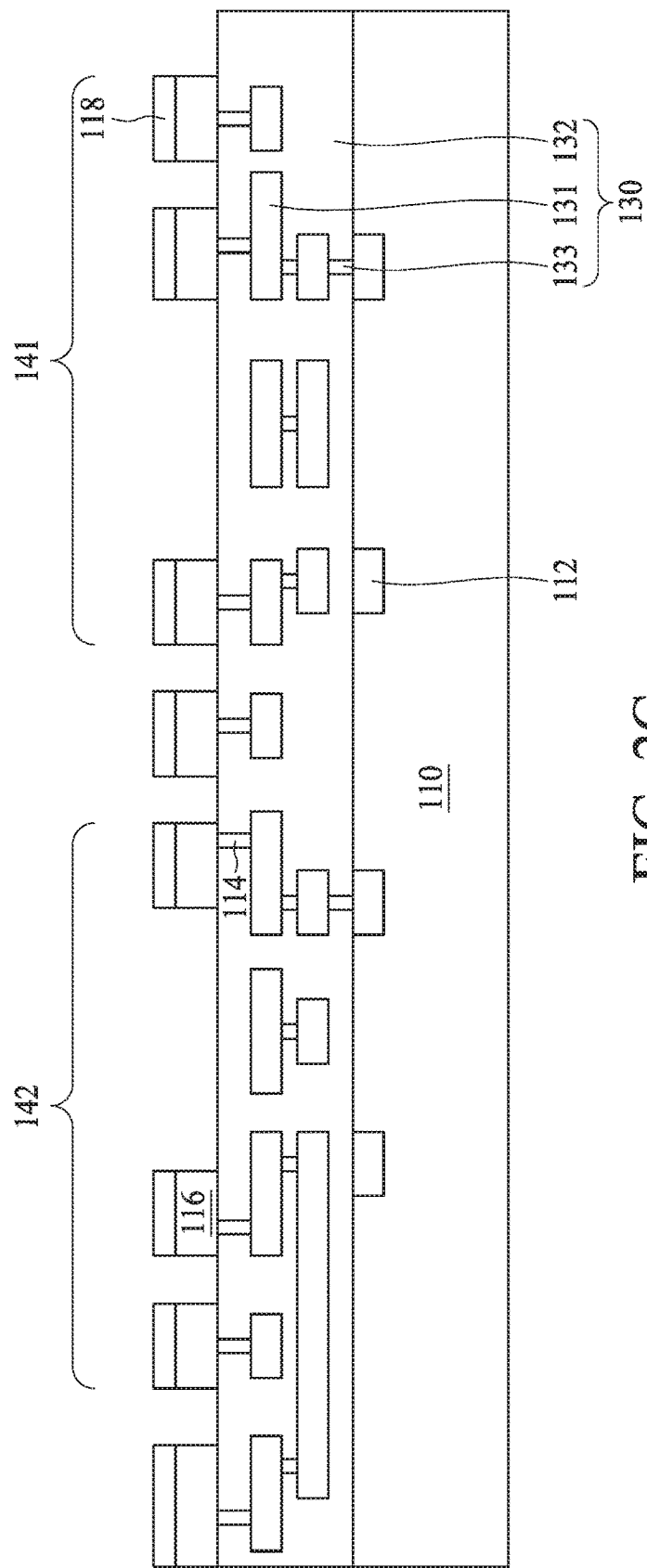
Figure 2D:
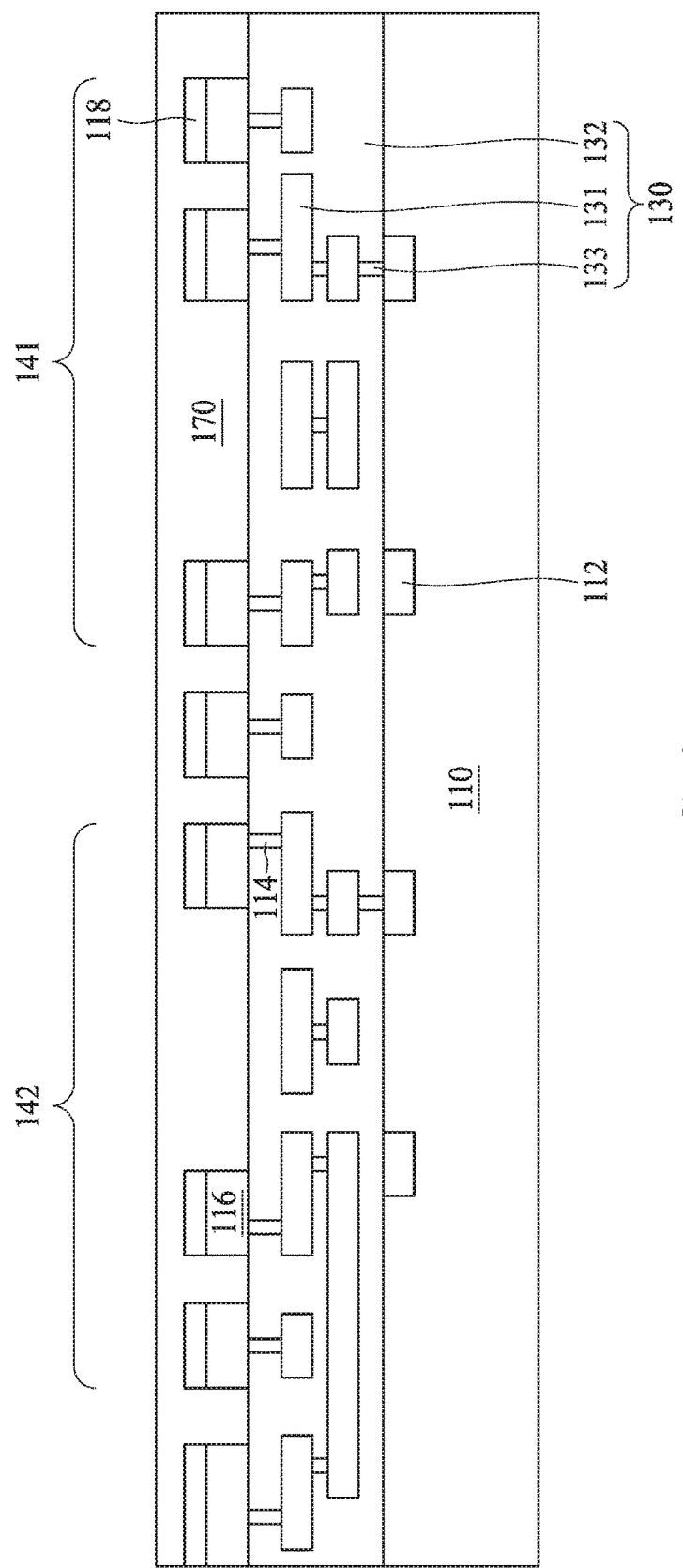

As depicted in FIG. 2C, an insulating layer 118 is deposited and patterned on the first conductor 116. As depicted in FIG. 2D and operation 240 in FIG. 2, a film 170 is formed to fill the plurality of gaps between the plurality of the first conductors 116 by deposition. Then a portion of film 170 is removed to reduce the as-deposition total thickness of film 170 to a predetermined value by using a chemical mechanical polishing (CMP) operation, an etch operation, or combinations thereof In some embodiments, the film 170 is formed by a high density plasma chemical vapor deposition (HDP-CVD).

In some embodiments, the film 170 can be made of oxide materials. In some embodiments, the film 170 may be silicon oxide such as Tetraethyl orthosilicate (TEOS). In some embodiments, the film 170 may be made of silicon oxide such as high density plasma (HDP) oxide. In some embodiments, the film 170 may include one or more relatively inert gases, for example helium, nitrogen or argon. In some embodiments, the film 170 may release gas, such as argon, hydrogen and nitrogen in a proceeding annealing operation.

Figure 2E:
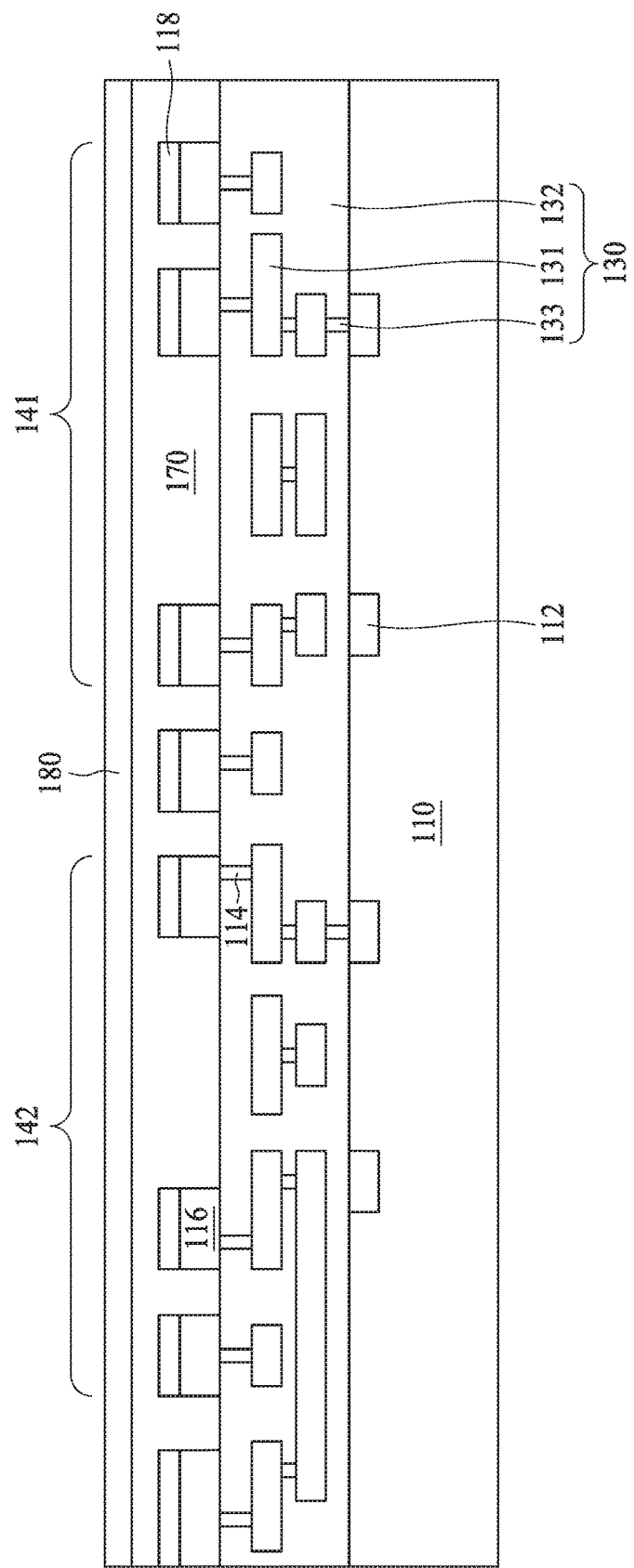

As depicted in FIG. 2E and operation 250 in FIG. 2, a barrier layer 180 is deposited on the film 170 by an electroplating operation, and then a portion of the harrier layer 180 is removed to reduce the as-deposition total thickness of the barrier layer 180 to a predetermined value by using a chemical mechanical polishing (CMP) operation, an etch operation, or combinations thereof In some embodiments, the barrier layer 180 can be made of a high compactness material which presents gas from out-diffusion and the high compactness material can be nitride materials.

Figure 2F:
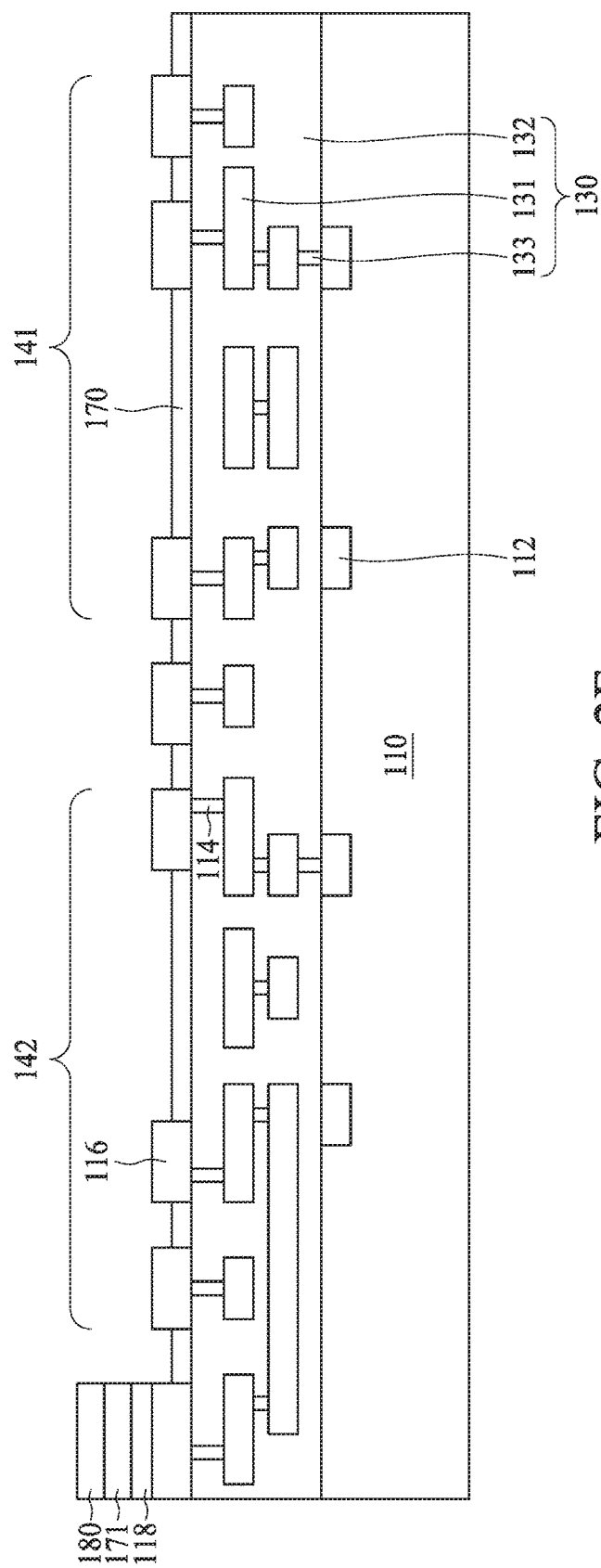

As depicted in FIG. 2F and operation 260 in FIG. 2, a photoresist layer (not shown) is deposited and patterned to form the insulating layer 118, the barrier layer 180 and a portion of the film 170 both in the first region 141 and the second region 142 are removed by an etch operation. In some embodiments, the etch operation in the present embodiment includes reactive ion etch (RIE) adopting fluorine-containing gases. The etch operation is conducted using a suitable etchant, such as fluorine-containing gases or $CF_4$, $CHF_3$, $CH_2F_2$, Ar, $N_2$, $O_2$ and He. As shown in FIG. 2F, a portion of the film 170 between the plurality of the first conductor 116 is kept both in the first region 141 and in the second region 142. In some embodiments, a portion of the insulating layer 118, the film 170 and the barrier layer 180 outside the first region 141 and the second region 142 is left and disposed on the first conductor 116. In some embodiments, the film 170 interposed between the insulating layer 118 and the barrier layer acts as a passivation layer 171.

Figure 2G:
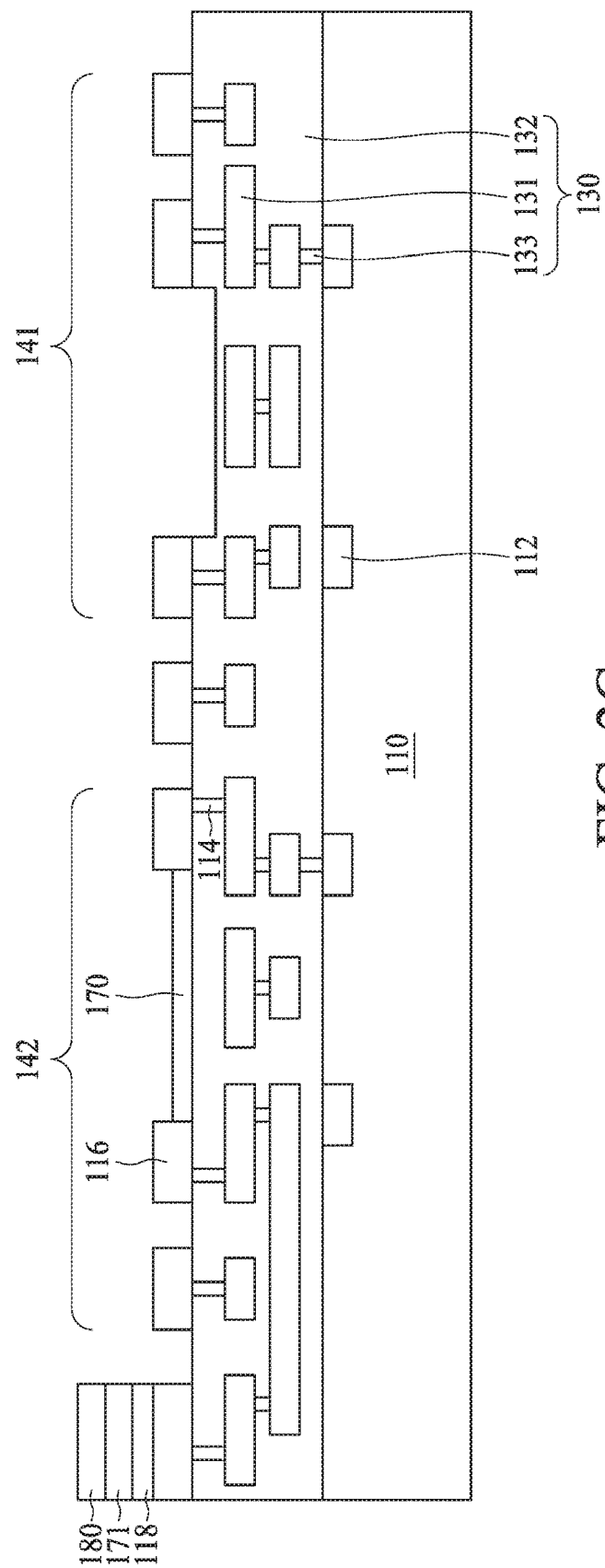

As depicted in FIG. 2G and operation 270 in FIG. 2, the film 170 is patterned and a portion of the film 170 is in the second region 142. The first region 141 is free from film 170, i.e. there is no film 170 remained in the first region 141. A photolithography and etch operation may be adopted for patterning the film 170. In some embodiments, referring to the second region 141 as shown in FIG. 2G, the film 170 is completely removed and then the dielectric layer 132 of the interconnection layer 130 is further recessed in the first region 141 to a lower level compared to the dielectric layer 132 under the film 170 in the first region 141.

As depicted in FIG. 2H, a second substrate 120 is received. In some embodiments, the second substrate 120 includes semiconductive materials. In some embodiments, the second substrate 120 includes silicon or other suitable materials. In some embodiments, the second substrate 120 includes electrical circuits formed over or in the second substrate 120. In some embodiments, the second substrate 120 is a MEMS substrate including electro-mechanical elements. In some embodiments, the second substrate 120 is patterned to form a first device 122 and a second device 124. The second substrate 120 may be patterned by any suitable patterning methods such as etching.

In some embodiments, the second substrate 120 includes the first device 122 and the second device 124. In some embodiments, the first device 122 and the second device 124 are MEMS devices. In some embodiments, the first device 122 is a gyroscope for measuring angular velocity. In some embodiments, the second device 124 is an accelerometer for measuring linear acceleration.

In some embodiments as shown in FIG. 2H, a plurality of second conductors 126 are disposed on a surface of the second substrate 120. In some embodiments, the second conductors 126 are configured to face the first conductors 116. In some embodiments, the second conductors 126 are formed by electroplating, sputtering or other suitable operations.

Figure 2I:
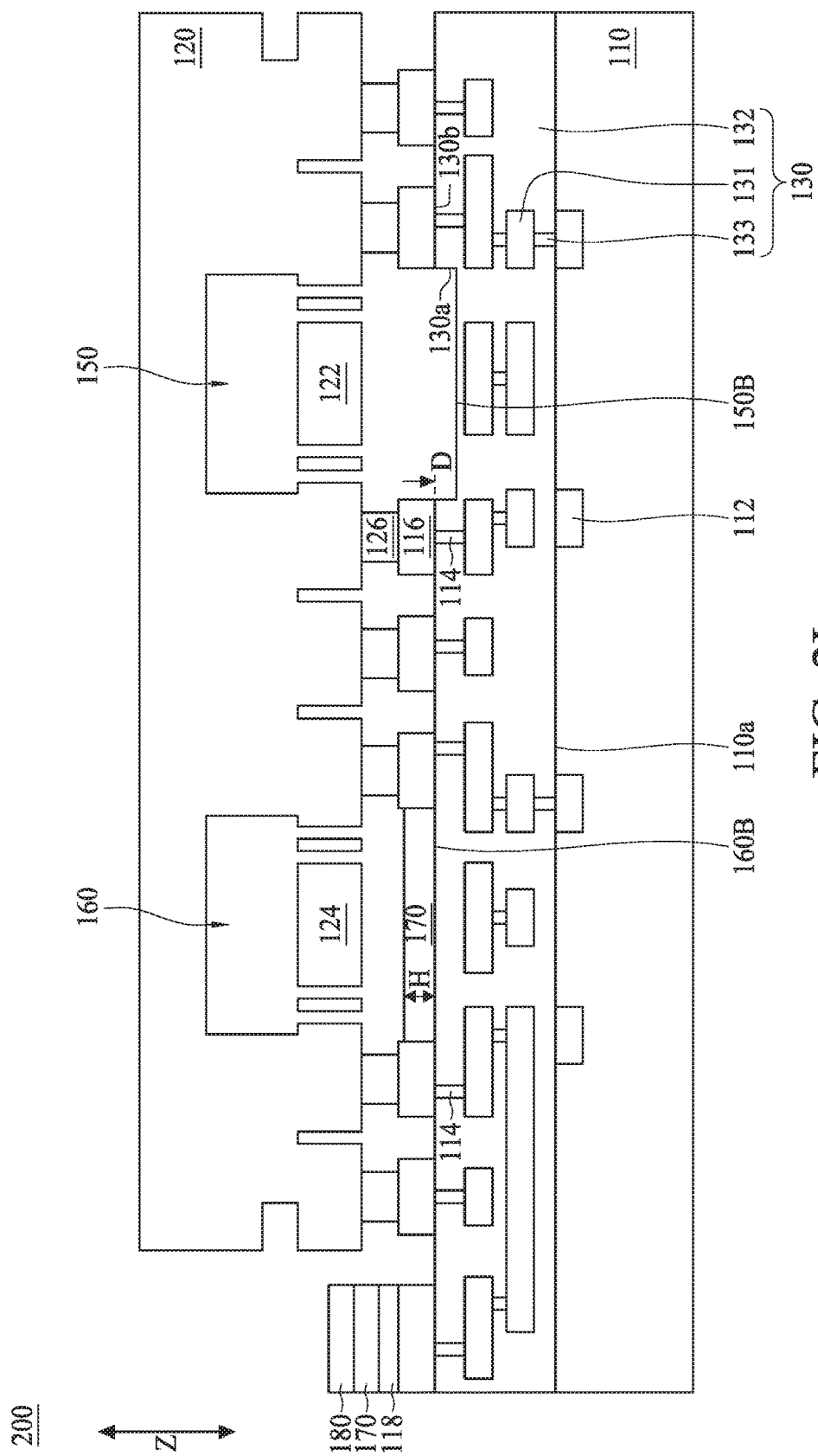

In some embodiments as shown in FIG. 2I, the second substrate 120 is bonded over the first substrate 110. In some embodiments, the second substrate 120 is disposed over and bonded with the first substrate 110. In some embodiments, the second substrate 120 is bonded with the first substrate 110 by any suitable bonding methods such as eutectic bonding, fusion bonding, or solid-liquid inter-diffusion bonding (SLID). In some embodiments, the second substrate 120 is bonded with the first substrate 110 through the first conductors 116 and the second conductors 126.

In some embodiments, as shown in FIG. 2I, the first conductors 116 are bonded with the second conductors 126, such that a circuitry of the second substrate 120 is electrically connected with a circuitry of the first substrate 110. In some embodiments, the first conductors 116 are eutectically bonded with the second conductors 126.

In some embodiments, a first cavity 150 and a second cavity 160 are formed when the second substrate 120 is disposed over the first substrate 110. In some embodiments, the first cavity 150 is formed and sealed by the first substrate 110 and the second substrate 120. In some embodiments, the second cavity 160 is formed and sealed by the first substrate 110 and the second substrate 120. In some embodiments, the first device 122 is disposed within the first cavity 150, and the second device 124 is disposed within the second cavity 160. In some embodiments, the first cavity 150 is insulated from the second cavity 160.

In some embodiments, a cavity pressure in the first cavity 150 is substantially same as a cavity pressure in the second cavity 160 when the second substrate 120 is eutectic bonded with the first substrate 110. In some embodiments, the first device 122 and the second device 124 are both in a vacuum or a high vacuum after disposing the second substrate 120 on the first substrate 110. As shown in FIG. 2I, a portion of the film 170 is kept in the bottommost surface 160B of the second cavity 160.

Figure 2J:
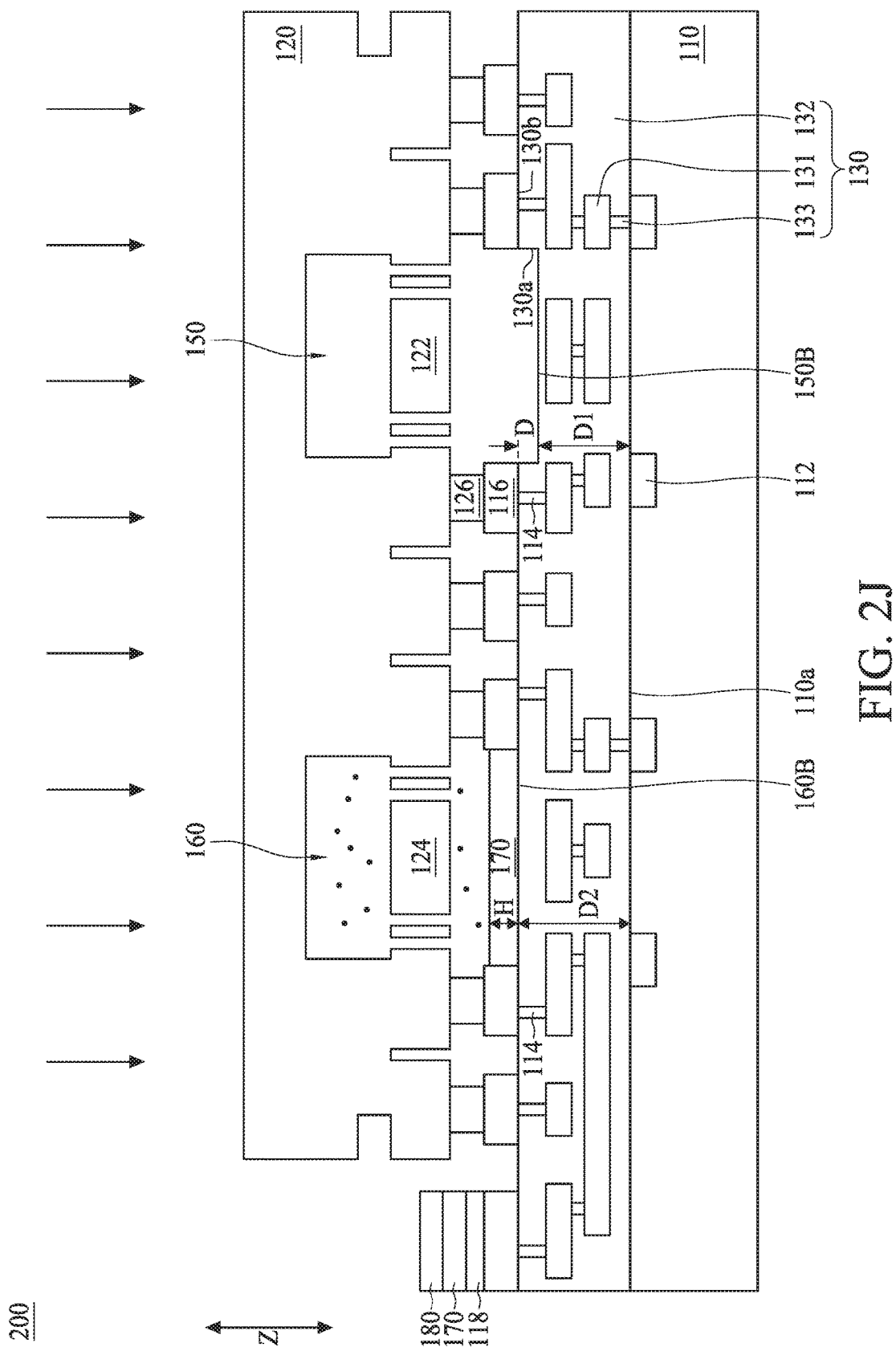

As depicted in FIG. 2J, after the bonding has been initiated by contacting the first substrate 110 with the second substrate 120, a heating operation may be introduced to the first substrate 110 or the second substrate 120. In some embodiments, the heating operation may be performed by annealing the first substrate 110 or the second substrate 120 at a temperature of between about 120° C. and about 650° C. When the heating operation is performed, the introduced heat drives atoms or molecules from the film 170 to vent into the hermetic cavity, for example, the second cavity 160, so as to adjust the barometric pressure in the second cavity 160. In some embodiments, the film 170 can be made of oxide materials. In some embodiments, the film 170 may be made of silicon oxide such as Tetraethyl orthosilicate (TEOS), or high density plasma (HDP) oxide. In some embodiments, the film 170 may release gas, such as argon, hydrogen and nitrogen to interfere with industrial vacuum processes.

As shown in 2J, black dots in the second cavity 160 represent atoms or molecules released in the second cavity 160. As a result, the second cavity 160 is no longer at low pressure when the semiconductive structure 200 is heated. In some embodiments, the film 170 in the first cavity 150 is completely digested such that no possible outgassing source, for any proceeding heat operation.

In some embodiments, a second cavity pressure in the second cavity 160 is substantially different from the first cavity pressure in the first cavity 150 after the film 170 out gas into the second cavity 160. In some embodiments, the film 170 allows a change of a cavity pressure in the second cavity 160. In some embodiments, the second cavity pressure in the second cavity 160 is changed from the first cavity pressure to a second cavity pressure when the film 170 out gas into the second cavity 160. In some embodiments, the second device 124 under the first cavity pressure is adjusted to the second cavity pressure. In some embodiments, the second cavity pressure is substantially different from the first cavity pressure. Therefore, the first cavity 150 is at the first cavity pressure and the second cavity 160 is at the second cavity pressure when the film 170 out gas into the second cavity 160.

In some embodiments, the second cavity 160 reaches the second cavity pressure when the film 170 out gas into the second cavity 160 and reaches a steady state condition. In me embodiments, the film 170 in the second cavity 160 may physically remain or disappear after the heating. In some embodiments, the second cavity 160 is under the second cavity pressure substantially greater than the first cavity pressure in the first cavity 150. In some embodiments, the second cavity 160 is under the second cavity pressure of about 1 atmospheric pressure (atm).

As a result, a semiconductive structure 100 or 200 including dual or multiple gas pressures therein is formed. The semiconductive structure 100 or 200 includes multiple devices operable under a cavity pressure different from each other. In some embodiments, the first device 122 is under the first cavity pressure, and the second device 124 is under the second cavity pressure substantially different from the first cavity pressure. For example, the first device 122 is under a vacuum while the second device 124 is under 1 atm. In some embodiments, the semiconductive structure 200 illustrated in FIG. 2J has similar configuration as in FIG. 1.

In the present disclosure, a semiconductive structure is provided. The semiconductive device includes a first substrate comprising an interconnection layer and a first conductor protruding from the interconnection layer. The semiconductive device includes a second substrate comprising a second conductor bonded with the first conductor. The semiconductive structure includes a first cavity between and sealed by the first substrate and the second substrate and the first cavity has a first cavity pressure. The semiconductive device includes a second cavity between and sealed by the first substrate and the second substrate and the second cavity has a second cavity pressure. A first surface of the interconnection layer is a sidewall of the first cavity. The first cavity pressure is less than the second cavity pressure.

In the present disclosure, a semiconductive structure is provided. The semiconductive device includes a first substrate having a plurality of first conductors, a second substrate in contact with the first substrate via a portion of the plurality of second conductors and a plurality of cavities between and sealed by the first substrate and the second substrate. The plurality of cavities comprises at least two different pressures.

In the present disclosure, a method of manufacturing a semiconductive structure is provided. The method includes receiving a first substrate, disposing an interconnection layer on the first substrate, forming a plurality of conductors over the interconnection layer, filing gaps between the plurality of conductors with a film, forming a barrier layer over the film, removing the barrier layer, and partially removing the film to expose a portion of the interconnection layer and leave a portion of the interconnection layer covered by the film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductive structure, comprising:
   a first substrate comprising:
      an interconnection layer; and
      a first conductor protruding from the interconnection layer;
   a second substrate comprising a second conductor bonded to the first conductor;
   a first cavity between and sealed by the first substrate and the second substrate, wherein the first cavity has a first cavity pressure; and
   a second cavity between and sealed by the first substrate and the second substrate, wherein the second cavity has a second cavity pressure,
   wherein the first cavity partially extends through the interconnection layer, and a first surface of the interconnection layer is a sidewall of the first cavity;
   the first cavity pressure is less than the second cavity pressure;
   a bottommost surface of the second cavity is substantially co-planar with a second surface of the interconnection layer substantially orthogonal to the first surface; and
   the second cavity is defined by the second surface of the interconnection layer and a surface of the second substrate, a surface of the first conductor and a surface of the second conductor.

2. The semiconductive structure of claim 1, further comprising an outgassing layer in the second cavity, wherein the outgassing layer is on the bottommost surface of the second cavity.

3. The semiconductive structure of claim 2, wherein the outgassing layer comprises an oxide.

4. The semiconductive structure of claim 2, wherein the outgassing layer comprises argon.

5. The semiconductive structure of claim 1, wherein the second cavity pressure is about 1 atm.

6. The semiconductive structure of claim 1, wherein a first device is positioned at the first cavity and a second device is positioned at the second cavity.

7. The semiconductive structure of claim 6, wherein the first device is a gyroscope and the second device is an accelerometer.

8. A semiconductive structure, comprising:
   a first substrate having an interconnection layer and a plurality of first conductors protruding from the interconnection layer;
   a second substrate in contact with the first substrate via a portion of the plurality of first conductors;
   a plurality of cavities between and sealed by the first substrate and the second substrate;
   wherein the plurality of cavities comprises at least two different pressures;
   wherein one of the plurality of cavities has a higher pressure with a first bottommost surface substantially co-planar with a surface of the interconnection layer, and another one of the plurality of cavities has a lower pressure with a second bottommost surface substantially lower than the surface of the interconnection layer, the one of the plurality of cavities is defined by the surface of the interconnection layer, a surface of the second substrate and a surface of the plurality of first conductors, and the another one of the plurality of cavities partially extends through the interconnection layer.

9. The semiconductive structure of claim 8, wherein one of the plurality of the first conductors provides a sidewall for one of the plurality of cavities.

10. The semiconductive structure of claim 8, wherein the second substrate is eutectically bonded to the first substrate.

11. The semiconductive structure of claim 8, wherein the second bottommost surface is substantially lower than the first bottommost surface.

12. The semiconductive structure of claim 8, further comprising an outgassing layer on the surface of the interconnection layer.

13. The semiconductive structure of claim 12, wherein the outgassing layer protrudes from the surface of the interconnection layer and extends to a first height.

14. The semiconductive structure of claim 8, wherein one of the plurality of the first conductors is adjacent to the interconnection layer.

15. A semiconductive structure, comprising:
- a bulk substrate comprising:
  - an active device formed in proximity to a surface of the bulk substrate; and
  - an interconnection layer disposed over the bulk substrate and electrically coupled to the active device;
- a bonding substrate, hermetically bonded to the bulk substrate through a plurality of conductors, wherein a first cavity and a second cavity are formed between the bonding substrate and the bulk substrate;
- wherein the first cavity is in a vacuum pressure and the second cavity is in a pressure higher than the vacuum pressure; and
- wherein a distance from a bottommost surface of the first cavity to the surface of the bulk substrate is less than a distance from a bottommost surface of the second cavity to the surface of the bulk substrate, and the second cavity is defined by a surface of the interconnection layer, a surface of the bonding substrate, and a surface of the plurality of conductors.

16. The semiconductive structure of claim 15, wherein the first cavity is hermetically isolated from the second cavity.

17. The semiconductive structure of claim 15, further comprising an outgassing layer disposed in the second cavity on the surface of the interconnection layer.

18. The semiconductive structure of claim 15, further comprising a device hermetically sealed in the first cavity.

19. The semiconductive structure of claim 15, wherein a portion of the interconnection layer is recessed from a top surface of the interconnection layer to have a depth in the first cavity.

20. The semiconductive structure of claim 19, wherein the recessed portion of the interconnection layer forms a sidewall of the first cavity.

* * * * *